United States Patent
Tan et al.

(10) Patent No.: US 8,295,982 B2
(45) Date of Patent: Oct. 23, 2012

(54) HEAT DISSIPATION APPARATUS, HEAT DISSIPATION METHOD THEREOF, AND CONTAINER DATA CENTER UTILIZING THE HEAT DISSIPATION APPARATUS

(75) Inventors: Zeu-Chia Tan, Taipei Hsien (TW); Tsung-Han Su, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 63 days.

(21) Appl. No.: 12/980,282

(22) Filed: Dec. 28, 2010

(65) Prior Publication Data

US 2012/0136488 A1    May 31, 2012

(30) Foreign Application Priority Data

Nov. 26, 2010    (TW) .............................. 99140883 A

(51) Int. Cl.
*G06F 19/00*    (2011.01)

(52) U.S. Cl. ....................................... 700/276; 361/688
(58) Field of Classification Search .................. 700/276; 361/688, 695, 690; 702/130; 703/1; 62/263
See application file for complete search history.

(56) References Cited

U.S. PATENT DOCUMENTS

| | | | | |
|---|---|---|---|---|
| 4,854,284 A | * | 8/1989 | Hara et al. | 123/406.52 |
| 6,374,627 B1 | * | 4/2002 | Schumacher et al. | 62/259.2 |
| 6,412,292 B2 | * | 7/2002 | Spinazzola et al. | 62/89 |
| 6,574,104 B2 | * | 6/2003 | Patel et al. | 361/695 |
| 7,991,592 B2 | * | 8/2011 | Vangilder et al. | 703/1 |
| 2003/0067745 A1 | * | 4/2003 | Patel et al. | 361/690 |
| 2004/0264124 A1 | * | 12/2004 | Patel et al. | 361/686 |
| 2005/0225936 A1 | * | 10/2005 | Day | 361/687 |
| 2006/0075764 A1 | * | 4/2006 | Bash et al. | 62/178 |

* cited by examiner

*Primary Examiner* — Kidest Bahta
(74) *Attorney, Agent, or Firm* — Altis Law Group, Inc.

(57) ABSTRACT

A heat dissipation apparatus includes an air conditioning unit, a plurality of temperature sensors, a plurality of adjustable air outlet boards, a plurality of actuators, and a control unit. The temperature sensors determine the temperature of server racks. The adjustable air outlet boards guide airflow from the air conditioning device to the corresponding server racks. The actuator adjusts the corresponding adjustable air outlet board to alter the airflow to the corresponding server rack. The control unit receives the temperature detected by the temperature sensors to submit corresponding control signals, altering power supplied to the air conditioning unit and adjust the adjustable air outlet boards through the actuators. The present disclosure further provides a heat dissipation method and a container data center including the heat dissipation apparatus as disclosed.

13 Claims, 4 Drawing Sheets

HEAT DISSIPATION APPARATUS, HEAT DISSIPATION METHOD THEREOF, AND CONTAINER DATA CENTER UTILIZING THE HEAT DISSIPATION APPARATUS

BACKGROUND

1. Technical Field

The present disclosure relates to heat dissipation, and particularly to a heat dissipation apparatus and method for container data centers.

2. Description of Related Art

A container data center has a plurality of server racks disposed therein. A conventional heat dissipation system dissipates the heat of container data centers by guiding cooling air produced by an air conditioning system to the bottom portion of the server racks. Consequently, all the server racks in a container data center receive cooling air of the same volume. However, even when only a portion of the server racks are active and others idle, the air conditioning system still supplies the same volume of cooling air to each of the server racks and power is thus wasted.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present heat dissipation apparatus and the present heat dissipation method. Moreover, in the drawings, like reference numerals designate corresponding parts throughout the several views.

DETAILED DESCRIPTION

Figure 1:
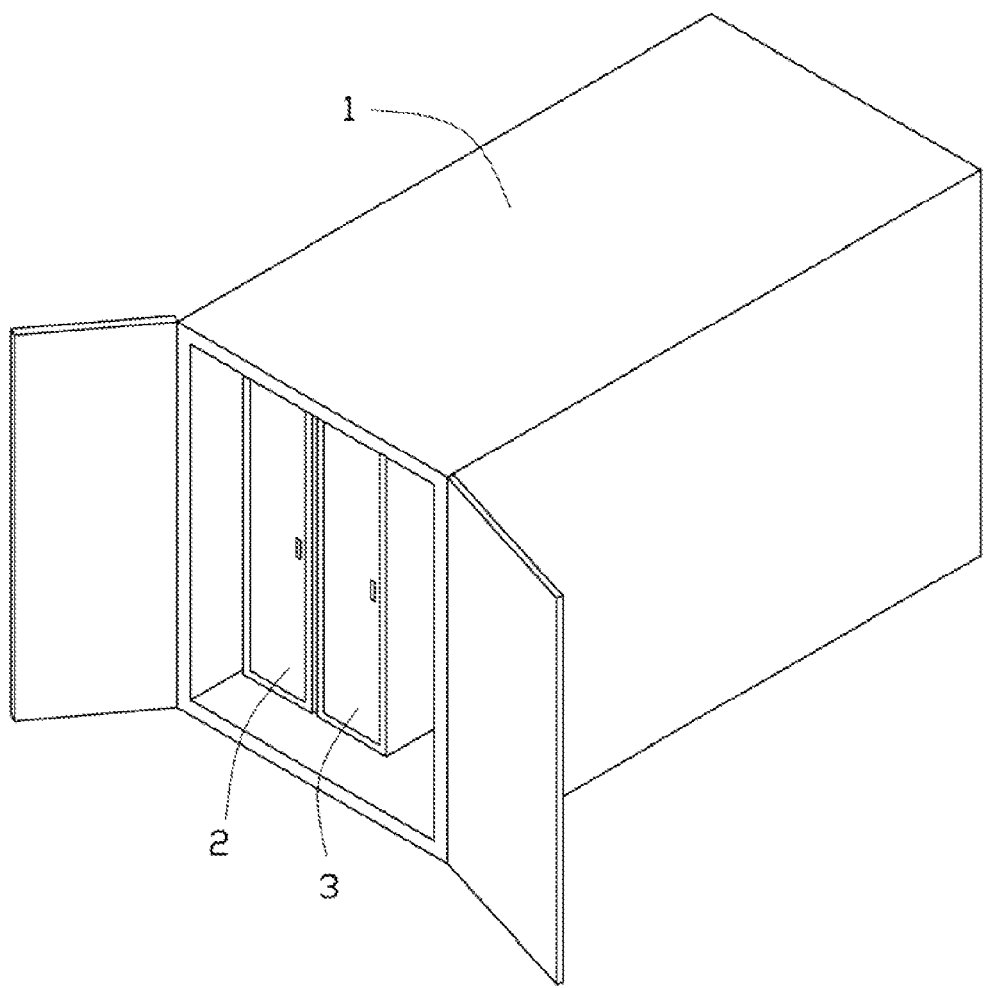
FIG. 1 is a schematic view of a preferred embodiment of a container data center of the present disclosure.
Figure 2:
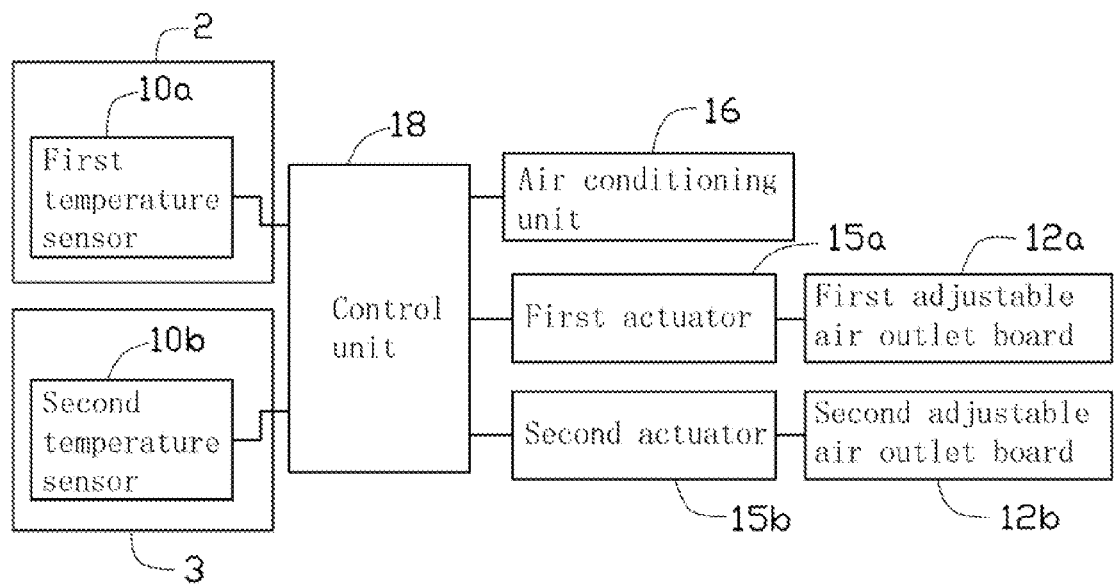
FIG. 2 is a block diagram of a preferred embodiment of a heat dissipation apparatus of the present disclosure.

As shown in FIG. 1 and FIG. 2, a heat dissipation apparatus of the present disclosure is disposed in a container data center 1 housing a plurality of server racks. In this embodiment, server racks 2 and 3 are housed in the container data center 1.

As shown in FIG. 2, a heat dissipation apparatus comprises a plurality of temperature sensors, a plurality of adjustable air outlet boards, a plurality of actuators, an air conditioning unit 16, and a control unit 18. In this embodiment, the heat dissipation apparatus includes a first temperature sensor 10a, a second temperature sensor 10b, a first adjustable air outlet board 12a, a second adjustable air outlet board 12b, a first actuator 15a, and a second actuator 15b.

Figure 3:
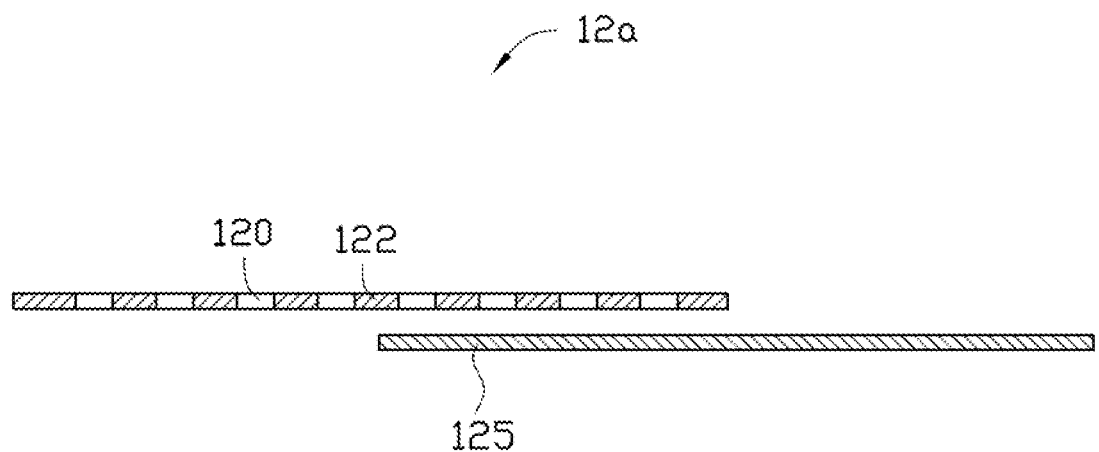
FIG. 3 is a schematic view of an adjustable air outlet board in FIG. 2.

The bottom portion of each of the server racks has an adjustable air outlet board disposed thereon, with each adjustable air outlet board corresponding to one of the actuators and connected thereto. The operating of the adjustable air outlet board is controlled by the corresponding actuator. The air conditioning unit 16 connects to each of the adjustable air outlet boards and deflects cooling air through the adjustable air outlet board to the corresponding server rack. As shown in FIG. 3, in this embodiment, each of adjustable air outlet boards 12a and 12b can include a first board 122 having a plurality of air vents 120 and a second board 125. The second board 125 can be controlled by the actuators, such as a stepper motor, so as to cover or uncover the air vents 120 on the first board 122 to alter airflow to the corresponding server rack.

The temperature sensors are disposed in the corresponding server rack and, after determining the temperature inside the server racks, transmitting the result to the control unit 18. In this embodiment, when the two server racks 2 and 3 become active, their corresponding adjustable air outlet boards have the same status, each receiving the same volume of cooling airflow. Since server rack 2 is active and server rack 3 idle, the temperature detected by the first temperature sensor 10a in the first server rack 2 is higher than that detected by the second temperature sensor 10b in the second server rack 3.

The control unit 18 submits control signals to the actuator 15a, 15b and the air conditioning unit 16 corresponding to the detected temperatures, whereby the opening of the adjustable air outlet board 12a or 12b and power supplied to the air conditioning unit 16 are adjusted accordingly, providing maximal dissipation effect, dissipating heat from the server racks with the lowest power consumption of the air conditioning unit 16.

Figure 4:
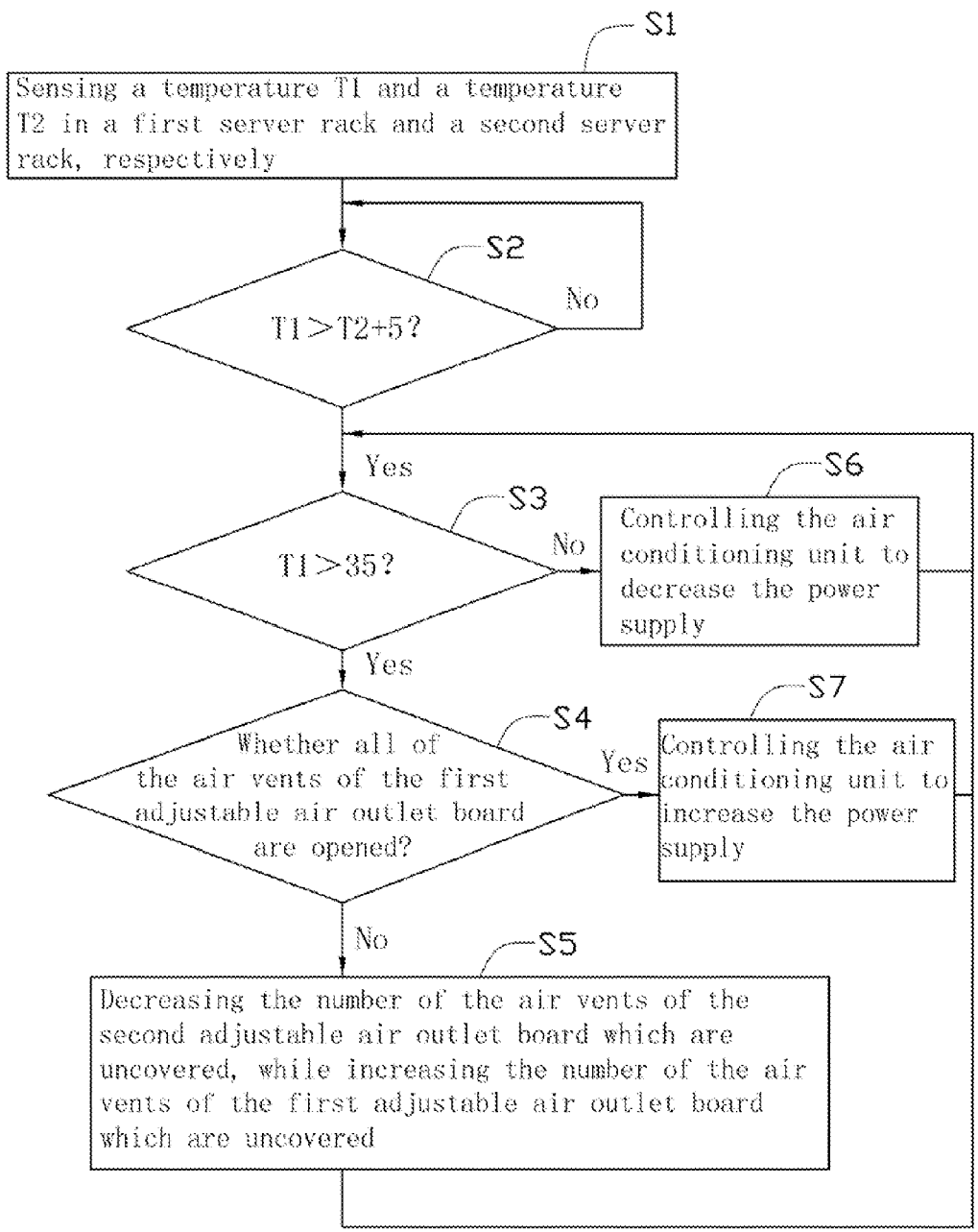
FIG. 4 is a flowchart of a preferred embodiment of the heat dissipation method of the present disclosure.

As shown in FIG. 4, a heat dissipation method as disclosed is as follows. Depending on the embodiment, additional blocks may be added, others removed, and the ordering of the blocks may be changed.

In block S1, the first temperature sensor 10a and the second temperature sensor 10b respectively detects a temperature T1 and a temperature T2 in a first server rack 2 and a second server rack 3. In this embodiment, the first temperature sensor 10a is a master which is active while the second temperature sensor 10b is a slave which is idle. The adjustable air outlet boards correspond to the two server racks have the same status, each receiving the same volume of cooling airflow. As a result, the temperature T1 in the first server rack 2 is higher than the temperature T2 in the second server rack 3.

In block S2, the control unit 18 determines whether the temperature T1 of the first server rack 2 is higher than the temperature T2 of the second server rack 3 by a predetermined value (in this embodiment, the predetermined value can be 5 degrees centigrade), i.e., whether the temperature T1 is higher than T2+5. If T1>T2+5, block S3 is implemented. If T1$\leq$T2+5, block S2 is implemented again.

In block S3, the control unit 18 determines whether the temperature T1 of the first server rack 2 is higher than another predetermined value (in this embodiment, another predetermined value can be 35 degrees centigrade), i.e., whether the temperature T1 being higher than 35 degrees centigrade. If T1>35, block S4 is implemented. If T1$\leq$35, block S6 is implemented.

In block S4, the control unit 18 determines whether all of the air vents 120 of the first adjustable air outlet board 12a are opened. If the air vents 120 are not all opened, block S5 is implemented. If the air vents 120 are all opened, block S7 is implemented. In this embodiment, the first actuator 15a is a stepper motor utilized to control the motion of the second board 125. Consequently, the control unit 18 can determine whether the air vents 120 of the adjustable air outlet board 12a are all opened through the step strokes of the first actuator 15a.

In block S5, the control unit 18 submits control signals to control the second actuator 15b to decrease the number of the air vents of the second adjustable air outlet board 12b which are uncovered, and increase the number of the air vents of the first adjustable air outlet board 12a which are uncovered. In this embodiment, a 10% opening ratio can be employed as the unit of uncovering the air vents of the adjustable air outlet board. In other words, the opening ratio of the air vents of the adjustable air outlet board will have a 10% increment or a 10% decrement in each step of adjusting the number of the air vents of the adjustable air outlet board which are uncovered. Then block S3 is implemented to continue to determine whether the temperature T1 of the first server rack 2 is higher than 35 degrees centigrade.

In block S6, the control unit 18 submits control signals to control the air conditioning unit 16 to decrease the power supply so as to save electrical energy. In this embodiment, a 5% of power can be employed as the unit of decrement. In other words, the power supplied to the air conditioning unit 16 will have a 5% decrement in each step of adjusting the power supplied to the air conditioning unit 16. Then block S3 is implemented.

In block S7, the control unit 18 submits control signals to control the air conditioning unit 16 to increase the power supply so as to strengthen the wind force. In this embodiment, a 5% of power can be employed as the unit of increment. In other words, the power supplied to the air conditioning unit 16 will have a 5% increment in each step of adjusting the power supplied to the air conditioning unit 16. Then block S3 is implemented.

The disclosed heat dissipation apparatus and method determine temperatures of server racks via temperature sensor, and adjust the size of air vents and power supplied to the air conditioning unit accordingly, enhancing heat dissipation efficiency effectively.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation apparatus applied to a container data center having a plurality of server racks disposed therein, the heat dissipation apparatus comprising:
   an air conditioning unit;
   a plurality of temperature sensors each disposed on the corresponding server rack and for sensing the temperature of the corresponding server rack;
   a plurality of adjustable air outlet boards each corresponding to one of the plurality of server racks and for guiding the airflow from the air conditioning device to the corresponding server rack;
   a plurality of actuators each corresponding to one of the plurality of adjustable air outlet boards and for adjusting the corresponding adjustable air outlet board to alter the airflow volume in the corresponding server rack; and
   a control unit for receiving the temperature detected by each of the plurality of temperature sensors, based on the temperature, to alter the power supplied to the air conditioning unit and adjust the adjustable air outlet boards through the actuators.

2. The heat dissipation apparatus of claim 1, wherein the container data center has a first server rack and a second server rack disposed therein, when the temperature of the first server rack is higher than that of the second server rack by a first predetermined value, the control unit submits a first control signal to adjust the adjustable air outlet board corresponding to the second server rack through the actuator corresponding to the second server rack, so as to decrease the airflow volume in the second server rack, while the control unit simultaneously submits a second control signal to adjust the adjustable air outlet board corresponding to the first server rack through the actuator corresponding to the first server rack, so as to increase the airflow volume in the first server rack.

3. The heat dissipation apparatus of claim 1, wherein the container data center has a first server rack and a second server rack disposed therein, when the temperature of the first server rack is higher than that of the second server rack by a first predetermined value and the temperature of the first server rack is lower than a second predetermined value, the control unit submits a third control signal to decrease the power supplied to the air conditioning unit; when the temperature of the first server rack is higher than that of the second server rack by the first predetermined value and the temperature of the first server rack is higher than the second predetermined value, the control unit submits a fourth control signal to increase the power supplied to the air conditioning unit.

4. The heat dissipation apparatus of claim 1, wherein each of the adjustable air outlet boards comprises a first board comprising a plurality of air vents and a second board controlled by the actuators to cover/uncover the air vents of the first board to alter the airflow volume in the corresponding server rack.

5. The heat dissipation apparatus of claim 3, wherein each of the adjustable air outlet boards comprises a plurality of air vents, when the temperature of the first server rack is higher than that of the second server rack by a first predetermined value and the temperature of the first server rack is lower than a second predetermined value, the control unit submits a third control signal to decrease the power supplied to the air conditioning unit; when the temperature of the first server rack is higher than that of the second server rack by the first predetermined value, the temperature of the first server rack is higher than the second predetermined value, and all of the air vents of the adjustable air outlet board are opened, the control unit submits a fourth control signal to increase the power supplied to the air conditioning unit; when the temperature of the first server rack is higher than that of the second server rack by the first predetermined value, the temperature of the first server rack is higher than the second predetermined value, and not all of the air vents of the adjustable air outlet board are opened, the control unit submits a first control signal to adjust the adjustable air outlet board corresponding to the second server rack through the actuator corresponding to the second server rack, so as to decrease the airflow volume in the second server rack, while the control unit simultaneously submits a second control signal to adjust the adjustable air outlet board corresponding to the first server rack through the actuator corresponding to the first server rack, so as to increase the airflow volume in the first server rack.

6. A container data center having a plurality of server racks and a heat dissipation apparatus, the heat dissipation apparatus comprising:
   an air conditioning unit;
   a plurality of temperature sensors each disposed on the corresponding server rack and for sensing the temperature of the corresponding server rack;
   a plurality of adjustable air outlet boards each corresponding to one of the plurality of server racks and for guiding the airflow from the air conditioning device to the corresponding server rack;
   a plurality of actuators each corresponding to one of the plurality of adjustable air outlet boards and for adjusting the corresponding adjustable air outlet board to alter the airflow volume in the corresponding server rack; and
   a control unit for receiving the temperature detected by each of the plurality of temperature sensors, based on the temperature, to control the actuators to adjust the adjustable air outlet boards and alter the power supplied to the air conditioning unit.

7. The container data center of claim 6, wherein the server racks includes a first server rack and a second server rack disposed therein, when the temperature of the first server rack is higher than that of the second server rack by a first predetermined value, the control unit submits a first control signal to adjust the adjustable air outlet board corresponding to the second server rack through the actuator corresponding to the second server rack, so as to decrease the airflow volume in the second server rack, while the control unit simultaneously submits a second control signal to adjust the adjustable air outlet board corresponding to the first server rack through the actuator corresponding to the first server rack, so as to increase the airflow volume in the first server rack.

8. The container data center of claim 6, wherein the container data center has a first server rack and a second server rack disposed therein, when the temperature of the first server rack is higher than that of the second server rack by a first predetermined value and the temperature of the first server rack is lower than a second predetermined value, the control unit submits a third control signal to decrease the power supplied to the air conditioning unit; when the temperature of the first server rack is higher than that of the second server rack by the first predetermined value and the temperature of the first server rack is higher than the second predetermined value, the control unit submits a fourth control signal to increase the power supplied to the air conditioning unit.

9. The container data center of claim 6, wherein each of the adjustable air outlet boards comprises a first board comprising a plurality of air vents and a second board controlled by the actuators to cover/uncover the air vents of the first board to alter the airflow volume in the corresponding server rack.

10. The container data center of claim 8, wherein each of the adjustable air outlet boards comprises a plurality of air vents, when the temperature of the first server rack is higher than that of the second server rack by a first predetermined value and the temperature of the first server rack is lower than a second predetermined value, the control unit submits a third control signal to decrease the power supplied to the air conditioning unit; when the temperature of the first server rack is higher than that of the second server rack by the first predetermined value, the temperature of the first server rack is higher than the second predetermined value, and all of the air vents of the adjustable air outlet board are opened, the control unit submits a fourth control signal to increase the power supplied to the air conditioning unit; when the temperature of the first server rack is higher than that of the second server rack by the first predetermined value, the temperature of the first server rack is higher than the second predetermined value, and not all of the air vents of the adjustable air outlet board are opened, the control unit submits a first control signal to adjust the adjustable air outlet board corresponding to the second server rack through the actuator corresponding to the second server rack, so as to decrease the airflow volume in the second server rack, while the control unit simultaneously submits a second control signal to adjust the adjustable air outlet board corresponding to the first server rack through the actuator corresponding to the first server rack, so as to increase the airflow volume in the first server rack.

11. A heat dissipation method applied to a container data center, the container data center having a plurality of server racks, an air conditioning unit, a plurality of temperature sensors, a plurality of adjustable air outlet boards, and a plurality of actuators, the heat dissipation method comprising:

sensing the temperature in each of the server racks through the temperature sensors, receiving the temperature detected by the temperature sensors, altering the power supplied to the air conditioning unit or adjusting the adjustable air outlet boards through the actuators to alter the airflow volume in the corresponding server rack, when the temperature of the first server rack is higher than that of the second server rack by a first predetermined value, the control unit submits a first control signal to adjust the adjustable air outlet board corresponding to the second server rack through the actuator corresponding to the second server rack, so as to decrease the airflow volume in the second server rack, while the control unit simultaneously submits a second control signal to adjust the adjustable air outlet board corresponding to the first server rack through the actuator corresponding to the first server rack, so as to increase the airflow volume in the first server rack.

12. The heat dissipation method of claim 11, wherein the server racks include a first server rack and a second server rack, the step "receiving the temperature detected by the temperature sensors, altering the power supplied to the air conditioning unit or adjusting the adjustable air outlet boards through the actuators to alter the airflow volume in the corresponding server rack" includes the following steps:

when the temperature of the first server rack is higher than that of the second server rack by a first predetermined value and the temperature of the first server rack is lower than a second predetermined value, the control unit submits a third control signal to decrease the power supplied to the air conditioning unit; and when the temperature of the first server rack is higher than that of the second server rack by the first predetermined value and the temperature of the first server rack is higher than the second predetermined value, the control unit submits a fourth control signal to increase the power supplied to the air conditioning unit.

13. The heat dissipation method of claim 12, wherein each of the adjustable air outlet boards comprises a plurality of air vents, when the temperature of the first server rack is higher than that of the second server rack by a first predetermined value and the temperature of the first server rack is lower than a second predetermined value, the control unit submits a third control signal to decrease the power supplied to the air conditioning unit; when the temperature of the first server rack is higher than that of the second server rack by the first predetermined value, the temperature of the first server rack is higher than the second predetermined value, and all of the air vents of the adjustable air outlet board are opened, the control unit submits a fourth control signal to increase the power supplied to the air conditioning unit; when the temperature of the first server rack is higher than that of the second server rack by the first predetermined value, the temperature of the first server rack is higher than the second predetermined value, and not all of the air vents of the adjustable air outlet board are opened, the control unit submits a first control signal to adjust the adjustable air outlet board corresponding to the second server rack through the actuator corresponding to the second server rack, so as to decrease the airflow volume in the second server rack, while the control unit simultaneously submits a second control signal to adjust the adjustable air outlet board corresponding to the first server rack through the actuator corresponding to the first server rack, so as to increase the airflow volume in the first server rack.

* * * * *